(12) United States Patent
de Valicourt et al.

(10) Patent No.: US 9,405,070 B1
(45) Date of Patent: Aug. 2, 2016

(54) OPTICAL BUFFER WITH A SIGNAL-SWITCHING CAPABILITY

(71) Applicant: Alcatel-Lucent USA Inc., Murray Hill, NJ (US)

(72) Inventors: Guilhem de Valicourt, Jersey City, NJ (US); Carlo Ferrari, Lausanne (CH)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 14/713,284

(22) Filed: May 15, 2015

(51) Int. Cl.
*G02B 6/28* (2006.01)
*G02B 6/12* (2006.01)
*H01S 3/067* (2006.01)
*G02F 1/01* (2006.01)
*G11C 21/00* (2006.01)

(52) U.S. Cl.
CPC .......... *G02B 6/2861* (2013.01); *G02B 6/12004* (2013.01); *G02F 1/011* (2013.01); *G11C 21/00* (2013.01); *H01S 3/06754* (2013.01)

(58) Field of Classification Search
CPC .................. G02B 6/2861; H01S 3/06754
See application file for complete search history.

(56) References Cited

U.S. PATENT DOCUMENTS

| | | | | |
|---|---|---|---|---|
| 5,121,240 | A * | 6/1992 | Acampora | G02B 6/2821 398/101 |
| 6,052,495 | A | 4/2000 | Little et al. | |
| 6,195,187 | B1 | 2/2001 | Soref et al. | |
| 6,504,969 | B1 * | 1/2003 | Tsao | G02F 1/3132 385/15 |
| 6,873,560 | B2 | 3/2005 | Pavlichek | |
| 6,900,920 | B2 | 5/2005 | Chang-Hasnain et al. | |
| 7,310,459 | B1 | 12/2007 | Rahman | |
| 7,680,361 | B2 | 3/2010 | Okayama | |
| 8,081,852 | B2 | 12/2011 | Tobing et al. | |
| 8,260,142 | B2 | 9/2012 | Bernasconi | |
| 8,494,315 | B2 | 7/2013 | Dupuis et al. | |
| 8,682,120 | B2 | 3/2014 | Doerr | |
| 8,699,836 | B2 | 4/2014 | Doerr | |
| 8,750,654 | B2 | 6/2014 | Dupuis et al. | |

(Continued)

OTHER PUBLICATIONS

Chi et al., "A large variable delay, fast reconfigurable optical buffer based on multi-loop configuration and an optical crosspoint switch matrix", proceedings of the Optical Fiber Communication Conference, 2006 and the 2006 National Fiber Optic Engineers Conference (2006).*

(Continued)

*Primary Examiner* — Eric Bolda
(74) *Attorney, Agent, or Firm* — Mendelsohn Dunleavy, P.C.; Yuri Gruzdkov (57) ABSTRACT

We disclose an optical buffer having a plurality of optical ports. In some embodiments, an optical signal to be stored may be injected into the buffer through any one of the optical ports and then may be ejected from the buffer, after being stored therein for a selectable amount of time, through any one of the optical ports as well. This feature advantageously enables the optical buffer to also function as an optical switch or router. In an example embodiment, the optical buffer comprises two optical recirculation loops, each of which can store the optical signal by causing it to circulate therein. The buffer is configured to compensate optical losses incurred by the optical signal during this circulation by transferring the optical signal from one loop to the other through an optical amplifier. Due to the latter feature, the optical buffer may be able to store an optical signal, with an acceptable OSNR, for a significantly longer time than certain conventional optical buffers.

20 Claims, 5 Drawing Sheets

(56) References Cited

U.S. PATENT DOCUMENTS

| | | | |
|---|---|---|---|
| 2006/0115210 A1* | 6/2006 | Nakagawa | H04J 14/0204 385/24 |
| 2010/0027023 A1* | 2/2010 | Sanders | G01N 21/7746 356/477 |
| 2010/0213473 A1 | 8/2010 | Gilton | |
| 2011/0109911 A1* | 5/2011 | Podoleanu | A61B 3/102 356/451 |
| 2013/0161496 A1 | 6/2013 | Akiyama | |

OTHER PUBLICATIONS

Yang, Haijun et al., All-Optical Variable Buffering Strategies and Switch Fabric Architectures for Future All-Optical Data Routers, Journal of Lightwave Technology, vol. 23, No. 10, Oct. 2005, pp. 3321-3330.

Yoo, S. J. Ben et al., "Petabit-per-Second Routers: Case for All-Optical over Electronic Implementation," Conference on Optical Fiber Communication and the National Fiber Optic Engineers Conference, 2007, pp. 1-3.

Melloni, A., et al., "Tunable Delay Lines in Silicon Photonics: Coupled Resonators and Photonic Crystals, a Comparison," IEEE Photonics Journal vol. 2, No. 2, 2010, pp. 181-194.

Tanushi, Yuichiro et al., "Design and Simulation of Ring Resonator Optical Swilches using Electro-Optic Materials," Japanese Journal of Applied Physics, vol. 4S, No. 4B, 2006. pp. 3493-3497.

Saito, Yuji et al., "Stopping of Light by the Dynamic Tuning of Photonic Crystal Slow Light Device," Optical Society of America, 2010, vol. 18, No. 16, pp. 17141-17153.

Liu, Yong, "All-Optical Buffering Based on Nonlinear Optical Processing with Semiconductor Optical Amplifiers," Faculty of Electrical Engineering of Eindhoven University of Technology Thesis, 2004 (136 pages).

Chang-Hasnain, Connie J., et al., "Variable Optical Buffer Using Slow Light in Semiconductor Nanostructures," Proceedings of the IEEE, vol. 91, No. 11, 2003, pp. 1884-1897.

Burmeister, E.F. et al., "A Comparison of Optical Buffering Technologies," Optical Switching and Networking, vol. 6, 2007, pp. 10-18.

De Valicourt, G., et al., "Monolithic Integrated Silicon-based Slot-Blocker for Packet-Switched Networks," European Conference on Optical Communication (ECOC), 2014, We.3.5.5, pp. 1-3.

Khurgin, Jacob B., "Optical Buffers Based on Slow Light in Electromagnetically Induced Transparent Media and Coupled Resonator Structures: Comparative Analysis," J. Opt. Soc. Am. B/vol. 22, No. 5, 2005, pp. 1062-1074.

"Photonic Crystal Ring Resonator Based Optical Filters," www.intechopen.com, 2013 [retrieved on Mar. 24, 2015] Retrieved from the Internet: <URL: http://www.intechopen.com/books/advances-in-photonic-crystals/photonic-crystal-ring-resonator-based-optical-filters> (24 pages).

Fegadolli, William S., et al., "Reconfigurable Silicon Thermo-optical Ring Resonator Switch Based on Vernier Effect Control," Optics Express vol. 20, No. 13, 2012, pp. 14722-14733.

Beheshti, Neda, et al., "Optical Packet Buffers for Backbone Internet Routers," IEEE/ACM Transactions on Networking, vol. 18, No. 5, 2010, pp. 1599-1609.

Park, Hyundai, et al., "40-Gb/s Optical Buffer Design and Simulation," Conference Paper, Proceedings of the 4th International Conference on Numerical Simulation of Optoelectronic Devices, 2004, (23 pages).

De Valicourt, G., et al., "High Gain (30 dB) and High Saturation Power (11 dBm) RSOA Devices as Colorless ONU Sources in Long-Reach Hybrid WDM/TDM-PON Architecture," Ieee Photonics Technology Letters, vol. 22, No. 3, 2010, pp. 191-193.

* cited by examiner

OPTICAL BUFFER WITH A SIGNAL-SWITCHING CAPABILITY

BACKGROUND

1. Field

The present disclosure relates to optical communications equipment and, more specifically but not exclusively, to optical memory and optical switches.

2. Description of the Related Art

This section introduces aspects that may help facilitate a better understanding of the disclosure. Accordingly, the statements of this section are to be read in this light and are not to be understood as admissions about what is in the prior art or what is not in the prior art.

Certain optical signal-processing applications, e.g., optical packet synchronization, all-optical routing, all-optical bit/label/header extraction or insertion, optical packet swapping in a data stream, etc., may require or benefit from optical buffering. An optical buffer is a device that is capable of temporarily storing light. As such, an optical buffer can be used to perform on optical signals some processing functions analogous to the processing functions that a conventional electrical buffer may perform on electrical signals. For example, in some applications, an optical buffer may operate to temporarily store a data packet encoded in a modulated optical carrier, without converting that modulated optical carrier into electrical form. An optical-buffer technology is currently being actively developed for this and other applications.

SUMMARY OF SOME SPECIFIC EMBODIMENTS

We disclose an optical buffer having a plurality of optical ports. In some embodiments, an optical signal to be stored may be injected into the buffer through any one of the optical ports and then may be ejected from the buffer, after being stored therein for a selectable amount of time, through any one of the optical ports as well. This feature advantageously enables the optical buffer to also function as an optical switch or router. In an example embodiment, the optical buffer comprises two optical recirculation loops, each of which can store the optical signal by causing it to circulate therein. The buffer is configured to compensate optical losses incurred by the optical signal during this circulation by transferring the optical signal from one recirculation loop to the other through an optical amplifier. Due to the latter feature, the optical buffer may be able to store an optical signal, with an acceptable optical signal-to-noise ratio (OSNR), for a significantly longer time than certain conventional optical buffers.

Some embodiments advantageously lend themselves to implementations in an integrated photonic circuit, e.g., using hybrid integration of active and passive planar waveguide devices.

According to an example embodiment, an optical buffer comprises: a first optical recirculation loop; a second optical recirculation loop; and an optical signal-transfer circuit that is configurable to perform an optical-signal transfer between the first optical recirculation loop and the second optical recirculation loop. The optical signal-transfer circuit comprises an optical amplifier configured to amplify an optical signal that is being transferred through the optical signal-transfer circuit between the first optical recirculation loop and the second optical recirculation loop.

BRIEF DESCRIPTION OF THE DRAWINGS

Other aspects, features, and benefits of various disclosed embodiments will become more fully apparent, by way of example, from the following detailed description and the accompanying drawings, in which.

DETAILED DESCRIPTION

Figure 1:
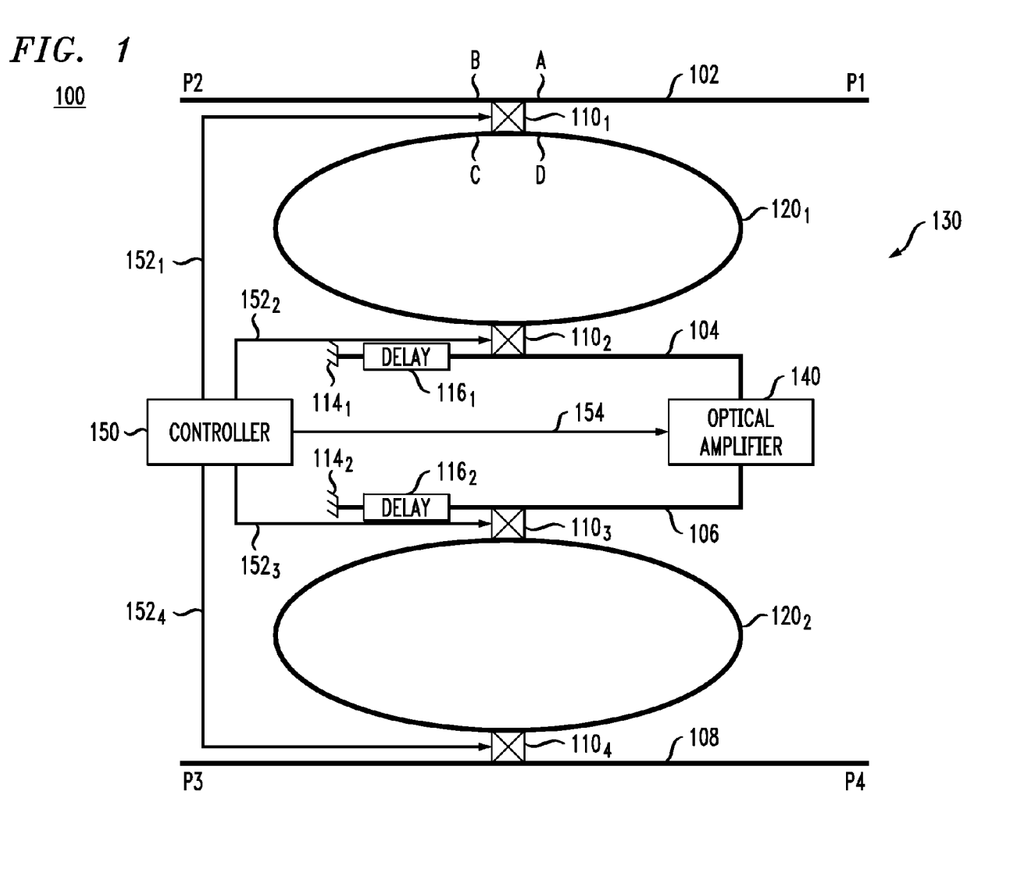
FIG. 1 shows a block diagram of an optical buffer according to an embodiment of the disclosure.

FIG. 1 shows a block diagram of an optical buffer 100 according to an embodiment of the disclosure. Buffer 100 has four optical ports labeled P1-P4. In various configurations of buffer 100, any of ports P1-P4 may be used as an input port or an output port, or both. Several example configurations, with specific port designations as input and/or output ports, are described below. Based on the provided description, a person of ordinary skill in the art will understand how to make and use various alternative configurations of buffer 100, with alternative port designations.

Ports P1 and P2 are directly connected to one another by an optical waveguide 102. Ports P3 and P4 are similarly connected by an optical waveguide 108. In various embodiments, each of optical waveguides 102 and 108 may be implemented using an optical fiber, an on-chip planar optical waveguide, or a combination thereof.

Buffer 100 further includes two optical recirculation loops $120_1$ and $120_2$ that are optically coupled to one another and to optical waveguides 102 and 108 as further described below. In an example embodiment, a recirculation loop 120 comprises a continuous loop of optical waveguide (e.g., on-chip optical waveguide or optical fiber) that can store one or more optical pulses or an optical packet (both hereafter referred to more generally as an "optical signal") by causing the optical signal to travel through the loop in round trips, without leaving the loop. The length of optical waveguide in recirculation loop 120 is selected to be such that the loop can accommodate the entire length of the optical signal that is being stored there, with the optical signal traveling through the waveguide at the speed of light. For example, recirculation loop 120 may be designed to have a length of optical waveguide that is larger than the physical length of a light wave carrying an optical signal whose duration is between several picoseconds and several microseconds.

An optical signal can be transferred between optical waveguide 102 and recirculation loop $120_1$ via a (re)configurable optical coupling structure $110_1$. An optical signal can similarly be transferred between optical waveguide 108 and recirculation loop $120_2$ via a (re)configurable optical coupling structure $110_4$. An optical signal can be transferred between recirculation loop $120_1$ and recirculation loop $120_2$ via an optical signal-transfer circuit 130.

In an example embodiment, optical signal-transfer circuit 130 comprises (re)configurable optical coupling structures $110_2$ and $110_3$ and an optical amplifier 140. Optical coupling structure $110_2$ is configurable to transfer an optical signal between recirculation loop $120_1$ and an optical waveguide 104. Optical coupling structure $110_3$ is similarly configurable to transfer an optical signal between recirculation loop $120_2$ and an optical waveguide 106. One end of optical waveguide 104 may incorporate an optional optical delay $116_1$ and is coupled to a mirror $114_1$, and the other end optical waveguide 104 is coupled to amplifier 140. Similarly, one end of optical waveguide 106 may incorporate an optional optical delay $116_2$ and is coupled to a mirror $114_2$, and the other end optical waveguide 106 is coupled to amplifier 140.

Configurations of optical coupling structures $110_1$-$110_4$ can be controlled by an electronic controller 150, e.g., using appropriate control signals applied to these optical coupling structures via electrical control lines or buses $152_1$-$152_4$, respectively. Electronic controller 150 also operates to set and, when necessary, change the optical gain of amplifier 140 using a control signal applied to the amplifier via an electrical control line or bus 154.

Amplifier 140 is a bidirectional optical amplifier. More specifically, an optical signal applied to amplifier 140 through optical waveguide 104 is amplified in the amplifier, and a resulting amplified optical signal is directed into optical waveguide 106. Similarly, an optical signal applied to amplifier 140 through optical waveguide 106 is amplified in the amplifier, and a resulting amplified optical signal is directed into optical waveguide 104. In an example embodiment, amplifier 140 may include one or more semiconductor optical amplifiers (SOAs). A possible embodiment of amplifier 140 is described in more detail below in reference to FIG. 3.

In one example embodiment, each of optical coupling structures $110_1$-$110_4$ may be implemented using a respective optical ring modulator or optical ring resonator. In an alternative embodiment, each of optical coupling structures $110_1$-$110_4$ can be implemented using a respective 2×2 optical switch. Other alternative embodiments of optical coupling structures $110_1$-$110_4$ are also possible.

For illustration purposes and without any unduly implied limitations, several example operating modes and configurations of buffer 100 are described below in reference to an embodiment, wherein each of optical coupling structures $110_1$-$110_4$ is implemented as an optical ring modulator. Based on the provided description, a person of ordinary skill in the art will understand how to set up additional operating modes for buffer 100 in general, and how to set up various operating modes for an embodiment of buffer 100, wherein optical coupling structures $110_1$-$110_4$ are implemented using optical switches and/or other suitable light-coupling elements in particular. For clarity of the description of possible operating modes that may be used in this particular embodiment, optical coupling structures $110_1$-$110_4$ are referred to in this description as optical ring modulators $110_1$-$110_4$. As already indicated above, other embodiments of optical coupling structures $110_1$-$110_4$ may also be used in buffer 100.

In operation, an optical ring modulator 110 can be switched between an ON state and an OFF state. These operating states are explained below in reference to optical ring modulator $110_1$ whose four optical ports are labeled A-D in FIG. 1. Each of optical ring modulators $110_2$-$110_4$ can be switched in a similar manner.

In an OFF state, control signal $152_1$ configures optical ring modulator $110_1$ in a manner that causes the optical ring modulator to provide substantially no optical coupling between optical waveguide 102 and recirculation loop $120_1$. Thus, when optical ring modulator $110_1$ is in the OFF state, light applied to optical port A continues on to optical port B, without crossing to optical port C or D. Light applied to optical port B continues on to optical port A, without crossing to optical port C or D. Light applied to optical port C continues on to optical port D, without crossing to optical port A or B. Light applied to optical port D continues on to optical port C, without crossing to optical port A or B.

In an ON state, control signal $152_1$ configures optical ring modulator $110_1$ in a manner that causes the optical ring modulator to transfer light between optical waveguide 102 and recirculation loop $120_1$. More specifically, light applied to optical port A is transferred to optical port D, with substantially no light coupling into optical ports B and C. Light applied to optical port B is transferred to optical port C, with substantially no light coupling into optical ports A and D. Light applied to optical port C is transferred to optical port B, with substantially no light coupling into optical ports A and D. Light applied to optical port D is transferred to optical port A, with substantially no light coupling into optical ports B and C.

Using the above-described port couplings in the OFF and ON states of optical ring modulators $110_1$-$110_4$, buffer 100 can be configured to process an optical signal applied to optical port P1, for example, as follows.

To direct the optical signal from port P1 to port P2, controller 150 sends on bus $152_1$ a control signal that causes optical ring modulator $110_1$ to be in the OFF state.

To inject the optical signal from port P1 into recirculation loop $120_1$, controller 150 sends on bus $152_1$ a control signal that causes optical ring modulator $110_1$ to be in the ON state. This causes the optical signal to cross from port P1 to port D and be injected into recirculation loop $120_1$ in the clockwise direction.

To store the optical signal in recirculation loop $120_1$, controller 150 sends on buses $152_1$ and $152_2$ control signals that cause optical ring modulators $110_1$ and $110_2$ to be in the OFF state. If the optical signal was injected into recirculation loop $120_1$ from port P1, then the optical signal is going to circulate (perform round trips) through this recirculation loop in the clockwise direction.

To transfer the optical signal from recirculation loop $120_1$ to recirculation loop $120_2$, controller 150 sends on buses $152_1$-$152_3$ control signals that cause optical ring modulators $110_1$-$110_3$ to be configured as follows. Optical ring modulator $110_1$ is in the OFF state. Optical ring modulators $110_2$ and $110_3$ are in the ON state. In this configuration, the optical signal first crosses from recirculation loop $120_1$ to optical waveguide 104, then passes through optical amplifier 140 to optical waveguide 106, and finally crosses from optical waveguide 106 to recirculation loop $120_2$. If the optical signal circulated in recirculation loop $120_1$ in the clockwise direction, then the optical signal is going to circulate through recirculation loop $120_2$ in the clockwise direction as well.

To store the optical signal in recirculation loop $120_2$, controller 150 sends on buses $152_3$ and $152_4$ control signals that cause optical ring modulators $110_3$ and $110_4$ to be in the OFF state.

To eject the optical signal from recirculation loop $120_2$, controller 150 sends on bus $152_4$ a control signal that causes optical ring modulator $110_4$ to be in the ON state. If the optical signal circulated in recirculation loop $120_2$ in the clockwise direction, then the optical signal is going to be ejected through port P4.

To transfer the optical signal from recirculation loop $120_2$ back to recirculation loop $120_1$, controller 150 sends on buses $152_2$-$152_4$ control signals that cause optical ring modulators $110_2$-$110_4$ to be configured as follows. Optical ring modulator $110_4$ is in the OFF state. Optical ring modulators $110_2$ and $110_3$ are in the ON state. In this configuration, the optical signal first crosses from recirculation loop $120_2$ to optical waveguide 106, then passes through optical delay $116_2$ and is reflected from mirror $114_2$, then passes through optical delay $116_2$ and optical amplifier 140 to optical waveguide 104, and finally crosses from optical waveguide 104 to recirculation loop $120_1$. If the optical signal circulated in recirculation loop $120_2$ in the clockwise direction, then the optical signal is going to circulate through recirculation loop $120_1$ in the counterclockwise direction.

Note that an optical-signal transfer from recirculation loop $120_1$ to recirculation loop $120_2$ and then back to recirculation loop $120_1$ causes a change in the circulation direction in the latter recirculation loop. Similarly, an optical-signal transfer from recirculation loop $120_2$ to recirculation loop $120_1$ and then back to recirculation loop $120_2$ causes a change in the circulation direction in the latter recirculation loop.

Depending on the optical-signal circulation direction in recirculation loop 120, the optical signal may be ejected at different optical ports of buffer 100. For example, as already mentioned above, an optical signal that circulates in recirculation loop $120_2$ in the clockwise direction is ejected through port P4. In contrast, an optical signal that circulates in recirculation loop $120_2$ in the counterclockwise direction is ejected through port P3. Similarly, an optical signal that circulates in recirculation loop $120_1$ in the clockwise direction is ejected through port P2, while an optical signal that circulates in recirculation loop $120_1$ in the counterclockwise direction is ejected through port P1. As already indicated above, a change in the circulation direction can be achieved by transferring the optical signal to the other recirculation loop and then back. Therefore, by properly selecting the number of transfers between recirculation loops $120_1$ and $120_2$, an optical signal stored in buffer 100 can be directed to any one of optical ports P1-P4.

A pass through optical amplifier 140 during an optical-signal transfer between recirculation loops $120_1$ and $120_2$ causes the power (light intensity) of the optical signal to be amplified. Controller 150 may use line or bus 154 to set the optical gain of amplifier 140 such that light amplification therein partially or fully offsets (i) the optical losses caused by optical-signal circulation in the originating recirculation loop and (ii) the optical losses in the other elements of transfer circuit 130 during the optical-signal transfer from the originating recirculation loop to the receiving recirculation loop. Due to this capability, an optical signal may advantageously be stored in buffer 100, with an acceptable OSNR, for a significantly longer time than in certain conventional optical buffers. A person of ordinary skill in the art will understand that a desired storage time can be achieved by appropriately selecting (i) the number of round trips in each of recirculation loops $120_1$ and $120_2$ between optical-signal transfers and (ii) the number of optical-signal transfers between the recirculation loops.

Although the above-provided description is given for an Input/Output (I/O) configuration in which optical port P1 operates as an input port, other I/O configurations are also possible. For example, in another I/O configuration, any other optical port (i.e., any of optical ports P2-P4) may be selected to operate as an input port. Based on the above description, a person of ordinary skill in the art will understand how to operate buffer 100 when signal is inserted into the buffer through any of optical ports P2-P4.

A person of ordinary skill in the art will further understand that, in some embodiments of buffer 100, various alternative designs and/or configurations of optical ring modulators/ resonators 110 may be used. For example, U.S. Pat. Nos. 7,310,459, 6,195,187, and 6,052,495 and U.S. Patent Application Publication No. 2013/0161496 disclose ring-resonator switches having some features that may be useful and/or beneficial in some alternative embodiments of buffer 100. These four patent-literature documents are incorporated herein by reference in their entirety.

As already indicated above, in some embodiments of buffer 100, optical coupling structures $110_1$-$110_4$ may be implemented using optical switches. For example, relatively fast optical switches that may be used for this purpose are disclosed, e.g., in G. de Valicourt, M. A. Mestre, L. Bramerie, et al., "Monolithic Integrated Silicon-Based Slot-Blocker for Packet-Switched Networks," published in the proceeding of ECOC 2014, Cannes, France, at We.3.5.5. This publication is incorporated herein by reference in its entirety.

Figure 2:
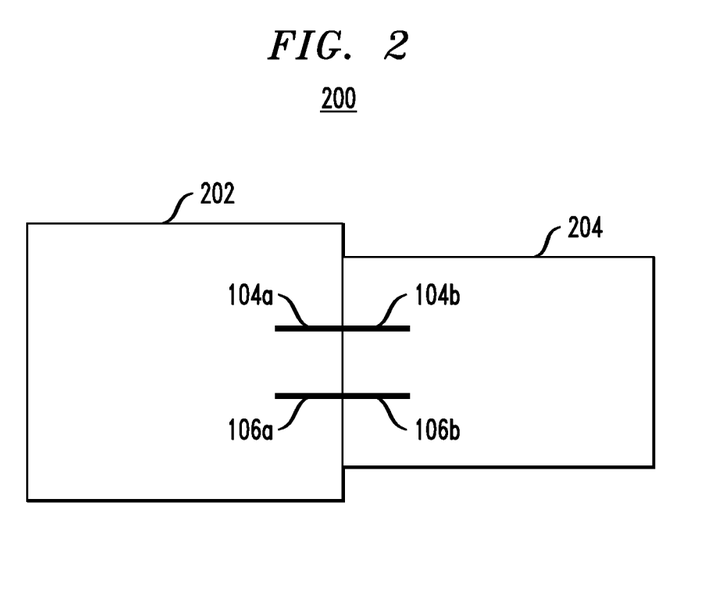
FIG. 2 shows a block diagram of a hybrid photonic circuit that can be used in the optical buffer of FIG. 1 according to an embodiment of the disclosure.

FIG. 2 shows a block diagram of an optical circuit 200 that can be used to implement optical buffer 100 (FIG. 1) according to an embodiment of the disclosure. Optical circuit 200 is a hybrid photonic circuit that comprises a passive circuit section 202 and an active circuit section 204. Circuit sections 202 and 204 are joined together such that (i) a portion 104*a* of optical waveguide 104 (FIG. 1) and a portion 106*a* of optical waveguide 106 (FIG. 1) are located in circuit section 202, and (ii) a portion 104*b* of optical waveguide 104 (FIG. 1) and a portion 106*b* of optical waveguide 106 (FIG. 1) are located in circuit section 204.

In an example embodiment, circuit section 202 may contain optical ports P1-P4, optical waveguides 102-108, optical coupling structures $110_1$-$110_4$, optical delays $116_1$ and $116_2$, and recirculation loops $120_1$ and $120_2$. Circuit section 202 may be fabricated, e.g., using a technology for fabricating silica waveguides on silicon or a technology for fabricating silicon waveguides in planar lightwave circuits (PLCs). Circuit section 204 may contain optical amplifier 140 and may be fabricated, e.g., using a III-V semiconductor technology.

Circuit sections 202 and 204 are attached to one another in a manner that causes light to transfer between waveguide portions 104*a* and 104*b* and between waveguide portions 106*a* and 106*b* with relatively low optical losses. In one embodiment, circuit sections 202 and 204 may be fabricated separately on different respective substrates and then joined together in a flip-chip or edge-to-edge chip assembly (also sometimes referred to as butt-coupled devices). In an alternative embodiment, circuit sections 202 and 204 may be fabricated on a common substrate using a suitable hybrid-circuit fabrication technology (e.g., including dies-to-wafer or wafer-to-wafer bonding). The common substrate used for this purpose may be silicon.

Figure 3:
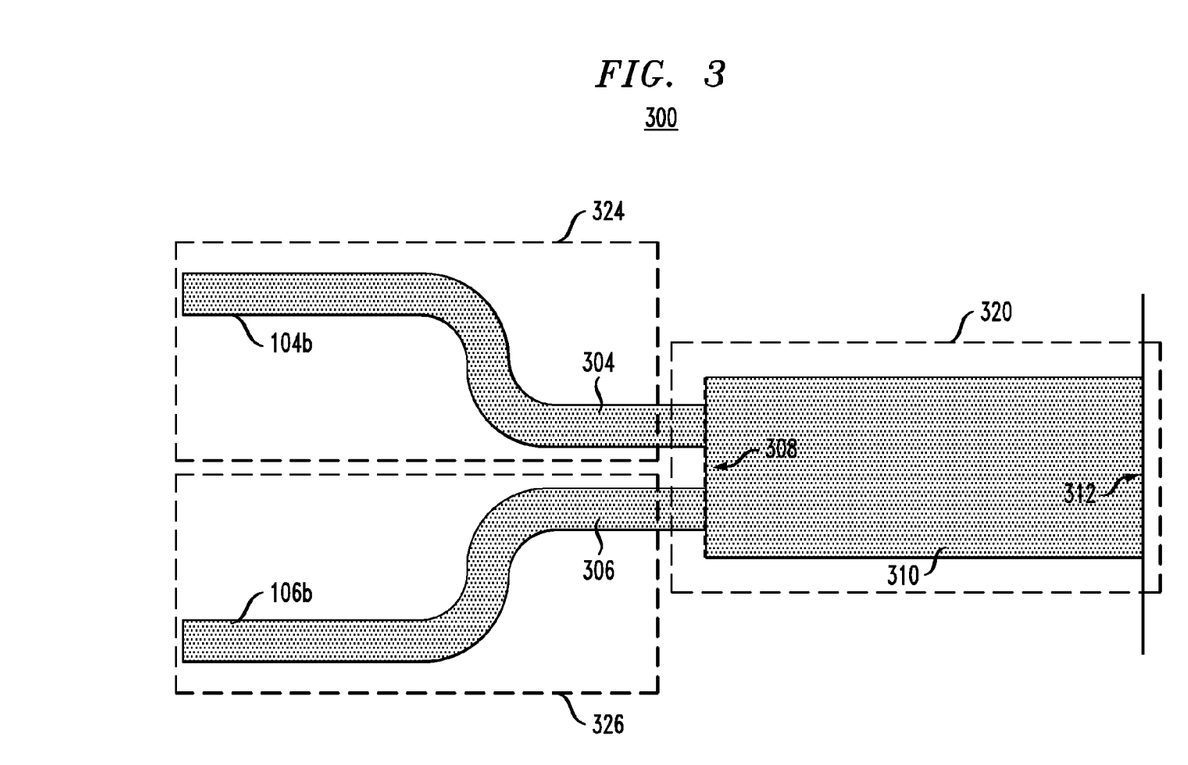
FIG. 3 shows a top view of a planar optical circuit that can be used in the optical buffer of FIG. 1 according to an embodiment of the disclosure.

FIG. 3 shows a top view of a planar optical circuit 300 that can be used to implement optical amplifier 140 (FIG. 1) according to an embodiment of the disclosure. In an example embodiment, circuit 300 may be a part of active circuit section 204 (FIG. 2). Waveguide portions 104*b* and 106*b* are shown in both FIG. 2 and FIG. 3 to more-clearly indicate a possible arrangement of various parts of circuit 300 within circuit section 204.

Circuit 300 implements a reflective bidirectional semiconductor optical amplifier (SOA) and, as such, may be fabricated using a stack of variously doped layers of a suitable semiconductor material. For example, in one embodiment, circuit 300 may be fabricated, as known in the art, using layers of p- and n-doped InP. In other embodiments, other semiconductor materials may similarly be used. One or more electrically conducting (e.g., metal) electrodes may be overlaid on the stack of doped semiconductor layers. In operation, the electrodes may be appropriately electrically biased to achieve carrier injection into the active layer of the stack to cause stimulated light emission therein. Possible electrode geometries that may be used in circuit 300 are indicated in FIG. 3 by the dashed lines.

Waveguide portions 104*b* and 106*b* are connected to optical waveguides 304 and 306, respectively, as indicated in FIG. 3. Optical waveguides 304 and 306 are further connected to a facet 308 of an optical waveguide 310. A reflective facet 312 of optical waveguide 310, which is opposite to facet 308, may be located at a solid/air interface of circuit 300. For light having a carrier wavelength for which circuit 300 is designed, facet 312 acts as a mirror.

In an example embodiment, optical waveguides 304 and 306 operate as single-mode waveguides, whereas optical waveguide 310 operates as a multimode waveguide. Positions of optical waveguides 304 and 306 along facet 308 are selected such that multimode interference within optical waveguide 310 causes the light that enters optical waveguide 310 through optical waveguide 304 to constructively refocus at the terminus of optical waveguide 306 after being reflected from facet 312. The refocused light then couples into optical waveguide 306 and exits circuit 300 through waveguide portion 106b. Similarly, the light that enters optical waveguide 310 through optical waveguide 306 is subjected to multimode interference and constructively refocuses at the terminus of optical waveguide 304. The refocused light then couples into optical waveguide 304 and exits circuit 300 through waveguide portion 104b. Due to these light-guiding properties, circuit 300 can operate as a bidirectional amplifier suitable for use as amplifier 140 (FIG. 1), in which the input and output waveguides are end-connected to the same facet, e.g., facet 308.

Three electrodes (labeled 320, 324, and 326) may be used with the waveguide layout shown in FIG. 3. Electrode 320 can be used to cause waveguide 310 to operate as an active zone of the resulting optical amplifier (i.e., a zone where the passing optical signal is amplified by stimulated emission). Electrodes 324 and 326 can be used to cause waveguides 304/104b and 306/106b, respectively, to operate as additional active zones.

In a first possible embodiment, circuit 300 may have only one of the three shown electrodes, e.g., electrode 320. In this particular embodiment, optical waveguides 304 and 306 are passive optical waveguides. In a second possible embodiment, circuit 300 may have all three shown electrodes, i.e., electrodes 320, 324, and 326. In a third possible embodiment, circuit 300 may have a single electrode that has a combined shape of electrodes 320, 324, and 326. Depending on the desired parameters of optical amplifier 140, any one of these three embodiments may be selected for use in circuit 200 (FIG. 2) and/or buffer 100 (FIG. 1). Some embodiments may benefit from the use of a double core structure for transitions between passive and active waveguides, e.g., described in G. de Valicourt et al., "High Gain (30 dB) and High Saturation Power (11 dBm) RSOA Devices as Colourless ONU Sources in Long Reach Hybrid WDM/TDM-PON Architecture", Photon. Technol. Letters, Vol. 22, No. 3, p. 191 (2010), which is incorporated herein by reference in its entirety.

Computer modeling and simulations may be used, as known in the art, to determine optimal waveguide geometry for circuit 300. For example, we have determined that the following geometry of an InP-based circuit 300 may be substantially optimal for amplifying optical signals having a carrier wavelength of 1.55 μm:
 (i) the length of waveguide 310 is 332 μm;
 (ii) the width of waveguide 310 is 15 μm;
 (iii) the distance between waveguides 304 and 306 at facet 308 is 6 μm;
  (iv) the width of waveguides 304 and 306 is 1.1 μm; and
  (v) the distance between waveguides 104b and 106b is either 127 μm or 250 μm.

Figure 4A:
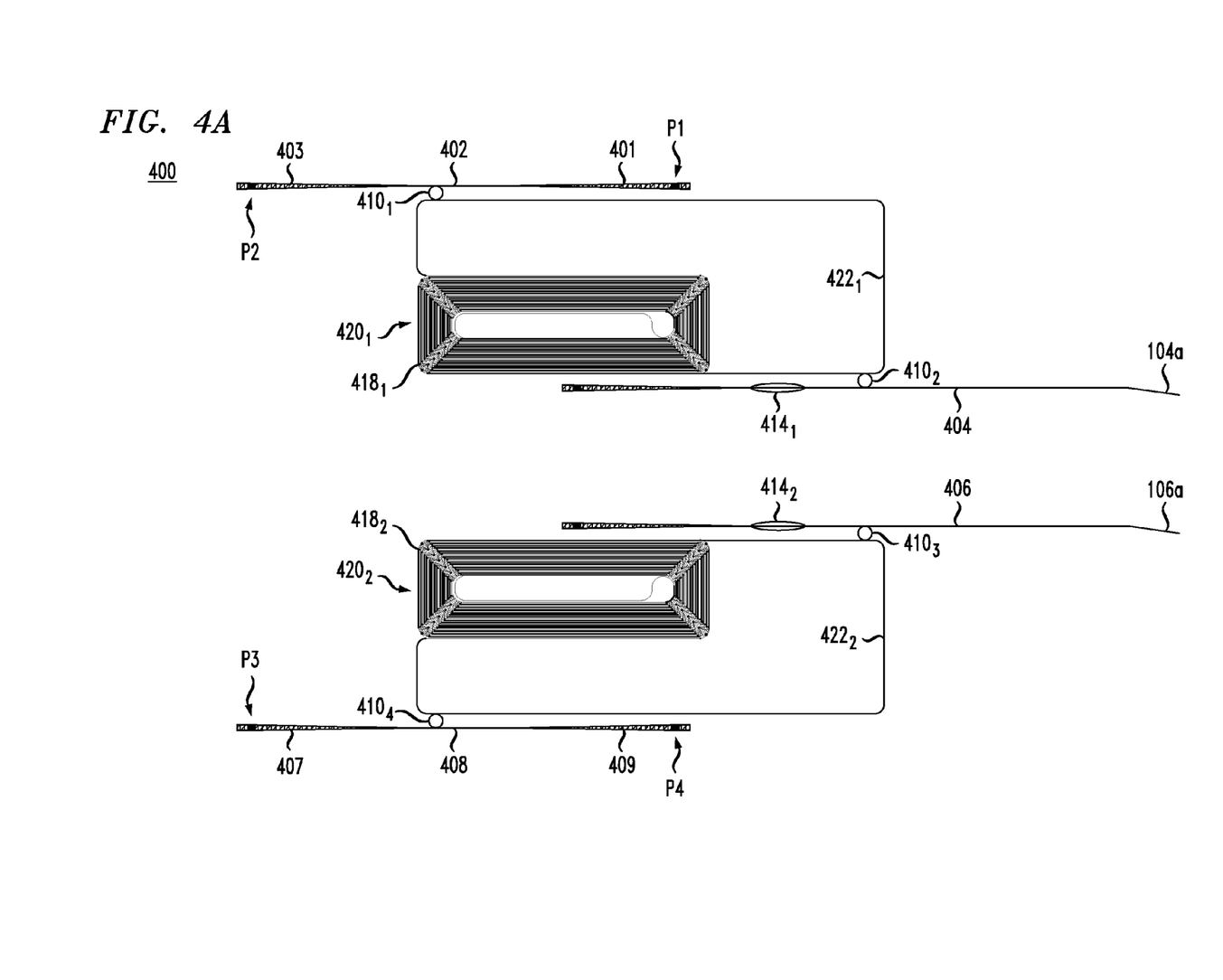
FIGS. 4A-4B show top views of another planar optical circuit that can be used in the optical buffer of FIG. 1 according to an embodiment of the disclosure.
Figure 4B:
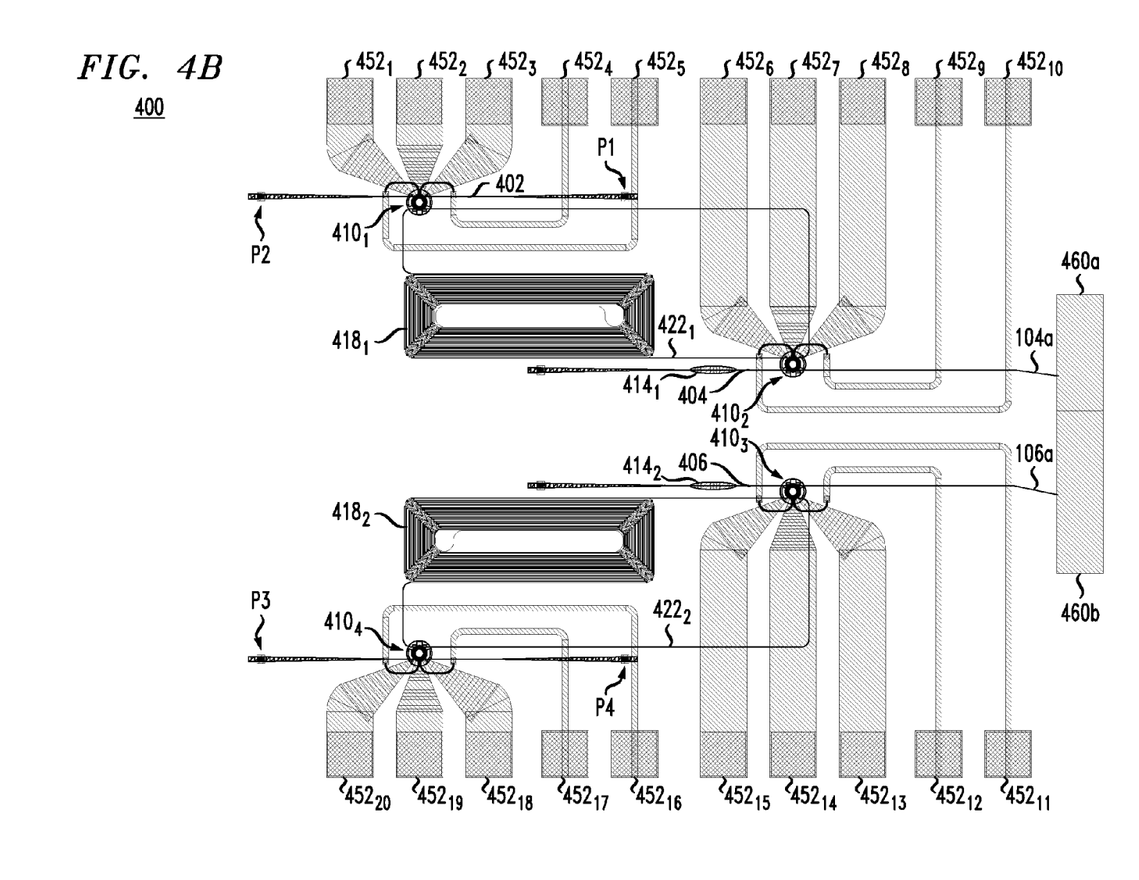

FIGS. 4A-4B show top views of a planar optical circuit 400 that can be used to implement circuit section 202 (FIG. 2) according to an embodiment of the disclosure. More specifically, FIG. 4A shows the layout of a waveguide layer in circuit 400. FIG. 4B shows the combined layout of a patterned metal layer, a doped semiconductor layer for the reconfigurable ring switch, a heater layer, a grating layer, and a slab layer in circuit 400, which combined layout is shown as being overlaid on the waveguide layer shown in FIG. 4A. Note that circuit 400 corresponds to an embodiment of buffer 100 (FIG. 1) in which optical delays $116_1$ and $116_2$ are absent.

Referring to FIG. 4A, optical ports P1-P4 in circuit 400 are implemented using four vertical grating couplers, where the term "vertical" refers to the direction orthogonal to the plane of the shown waveguide layer and FIG. 4A. Optical ports P1 and P2 are optically coupled to an optical waveguide 402 via tapered waveguide sections 401 and 403, respectively. Optical ports P3 and P4 are optically coupled to an optical waveguide 408 via tapered waveguide sections 407 and 409, respectively.

In a example embodiment, a grating coupler used in each of optical ports P1-P4 includes a waveguide grating formed by a periodic array of features (e.g., holes or grooves) in the corresponding waveguide that cause a beam of light that is applied to the grating vertically or at a slightly tilted angle to diffract horizontally into the corresponding tapered waveguide section adjacent to the grating. Similarly, a beam of light that is applied to the grating horizontally through the corresponding tapered waveguide section adjacent to the grating is diffracted vertically out of the plane of the waveguide layer. Various waveguide gratings that may be used to implement optical ports P1-P4 in circuit 400 are disclosed, e.g., in commonly owned U.S. Pat. Nos. 8,494,315, 8,682,120, 8,699,836, and 8,750,654, all of which are incorporated herein by reference in their entirety.

Circuit 400 has two optical recirculation loops $420_1$ and $420_2$ that are implemented using double-spiral waveguide structures $418_1$ and $418_2$, respectively. Each of double-spiral waveguide structures $418_1$ and $418_2$ comprises two waveguide spirals that are end-connected to one another near the geometric center of the spirals. A waveguide 422 is configured to connect the peripheral ends of the two waveguide spirals of structure 418, thereby self-shorting the optical path of the corresponding recirculation loop 420. In operation, a first of the two waveguide spirals guides the optical signal from the periphery of structure 418 to its center. A second of the two waveguide spirals then guides the optical signal from the center back to the periphery of structure 418. Finally, waveguide 422 directs the optical signal from the peripheral end of one of the waveguide spirals to the peripheral end of the other waveguide spiral. Because double-spiral waveguide structures $418_1$ and $418_2$ are designed to pack a relatively large length of optical waveguide into a relatively small surface area, circuit 400 may advantageously have a relatively small size.

Waveguide rings $410_1$ and $410_2$ are configured to optically couple optical recirculation loop $420_1$ to waveguides 402 and 404, respectively. Waveguide rings $410_3$ and $410_4$ are similarly configured to optically couple optical recirculation loop $420_2$ to waveguides 406 and 408, respectively. Waveguides 404 and 406 are connected to waveguide portions 104a and 106a, respectively, as indicated in FIG. 4A. Waveguide 404 includes a Bragg reflector $414_1$. Similarly, waveguide 406 includes a Bragg reflector $414_2$. Bragg reflectors $414_1$ and $414_2$ implement mirrors $114_1$ and $114_2$, respectively (see FIG. 1).

In some embodiments, each of waveguide rings $410_1$-$410_4$ may be replaced by a respective set two or more cascaded waveguide rings. The use of such cascaded waveguide rings instead of a single waveguide ring may beneficially change the filtering characteristics of the corresponding optical coupling structure.

The additional patterned layers shown in FIG. 4B add electrodes to each of waveguide rings $410_1$-$410_4$, thereby enabling these waveguide rings to operate as optical ring modulators. Control voltages to the ring electrodes are applied via metal tracks $452_1$-$452_{20}$. More specifically, metal tracks $452_1$-$452_5$ are configured to provide control voltages to the electrodes connected to waveguide ring $410_1$. These control voltages may be applied to metal tracks $452_1$-$452_5$ by controller 150 via electrical control bus $152_1$ (see FIG. 1). Metal tracks $452_6$-$452_{10}$ are configured to provide control voltages to the electrodes connected to waveguide ring $410_2$. These control voltages may be applied to metal tracks $452_6$-$452_{10}$ by controller 150 via electrical control bus $152_2$ (see FIG. 1). Metal tracks $452_{11}$-$452_{15}$ are configured to provide control voltages to the electrodes connected to waveguide ring $410_3$. These control voltages may be applied to metal tracks $452_{11}$-$452_{15}$ by controller 150 via electrical control bus $152_3$ (see FIG. 1). Metal tracks $452_{16}$-$452_{20}$ are configured to provide control voltages to the electrodes connected to waveguide ring $410_4$. These control voltages may be applied to metal tracks $452_{16}$-$452_{20}$ by controller 150 via electrical control bus $152_4$ (see FIG. 1).

Also shown in FIG. 4B are optional tilted inverted tapers 460a and 460b that may be used for more efficient light coupling between waveguide portions 104a/104b and 106a/106b. More specifically, tilted inverted tapers 460a and 460b help to improve waveguide mode matching between passive circuit section 202 and active circuit section 204 (see FIG. 2) and to reduce optical coupling losses between the silicon and the III-V material. Tapers 460a and 460b (along with antireflection coating) may also serve to reduce signal attenuation due to reflective losses at the interface of circuit sections 202 and 204.

A person of ordinary skill in the art will understand that circuit 400 may be modified in a relatively straightforward manner to correspond to an embodiment of buffer 100 (FIG. 1) in which optical delays $116_1$ and $116_2$ are present. For example, two additional double-spiral waveguide structures, each similar to structure 418, may be inserted into waveguides 404 and 406. These two additional double-spiral waveguide structures will operate as optical delays $116_1$ and $116_2$, respectively.

According to an example embodiment disclosed above in reference to FIGS. 1-4, provided is an apparatus (e.g., 100, FIG. 1) comprising: a first optical recirculation loop (e.g., $120_1$, FIG. 1); a second optical recirculation loop (e.g., $120_2$, FIG. 1); and an optical signal-transfer circuit (e.g., 130, FIG. 1) that is configurable to perform an optical-signal transfer between the first optical recirculation loop and the second optical recirculation loop. The optical signal-transfer circuit comprises an optical amplifier (e.g., 140, FIG. 1) configured to amplify an optical signal that is being transferred through the optical signal-transfer circuit between the first optical recirculation loop and the second optical recirculation loop.

In some embodiments of the above apparatus, the optical signal-transfer circuit is configured to cause a single pass of the optical signal through the optical amplifier per optical-signal transfer between the first optical recirculation loop and the second optical recirculation loop.

In some embodiments of any of the above apparatus, the optical signal-transfer circuit is further configurable to optically isolate the first optical recirculation loop and the second optical recirculation loop from one another. As used herein the term "optically isolate" means to keep signal transfer under a fixed predetermined threshold. In an example embodiment of buffer 100 such threshold may be 25 dB.

In some embodiments of any of the above apparatus, the apparatus further comprises an electronic controller (e.g., 150, FIG. 1) configured to cause the optical signal-transfer circuit either to perform the optical-signal transfer or to optically isolate the first optical recirculation loop and the second optical recirculation loop from one another.

In some embodiments of any of the above apparatus, the electronic controller is configured to set a storage time for the optical signal by (i) setting a number of optical-signal transfers between the first optical recirculation loop and the second optical recirculation loop and/or (ii) setting a number of optical-signal round trips in either or both of the first and second optical recirculation loops.

In some embodiments of any of the above apparatus, the optical signal-transfer circuit is reconfigurable to perform the optical-signal transfer in a first direction or in a second direction, the first direction being from the first optical recirculation loop to the second optical recirculation loop, and the second direction being from the second optical recirculation loop to the first optical recirculation loop.

In some embodiments of any of the above apparatus, the optical amplifier comprises a bidirectional amplifier (e.g., 300, FIG. 3) configured to amplify optical signals transferred through the optical signal-transfer circuit in both the first direction and the second direction.

In some embodiments of any of the above apparatus, the bidirectional amplifier comprises: a multimode waveguide (e.g., 310, FIG. 3) having a first end-facet (e.g., 308, FIG. 3) and a second end-facet (e.g., 312, FIG. 3); a first single-mode waveguide (e.g., 304, FIG. 3) end-connected to the first end-facet; and a second single-mode waveguide (e.g., 306, FIG. 3) end-connected to the first end-facet. The bidirectional amplifier is configured to: direct an optical signal propagating in the first direction from the first single-mode waveguide, through the multimode waveguide, and into the second single-mode waveguide in a manner that causes said optical signal to be reflected from the second end-facet of the multimode waveguide; and direct an optical signal propagating in the second direction from the second single-mode waveguide, through the multimode waveguide, and into the first single-mode waveguide in a manner that causes said optical signal to be reflected from the second end-facet of the multimode waveguide.

In some embodiments of any of the above apparatus, at least a portion (e.g., under 320, FIG. 3) of the multimode waveguide is configured to operate as an active zone of the bidirectional amplifier.

In some embodiments of any of the above apparatus, at least a portion (e.g., under either 324 or 326, or under both 324 and 326, FIG. 3) of either the first single-mode waveguide or the second single-mode waveguide is configured to operate as an active zone of the bidirectional amplifier.

In some embodiments of any of the above apparatus, the apparatus further comprises: a first optical port (e.g., P1, FIG. 1); and a first optical coupling structure (e.g., $110_1$, FIG. 1) that is configurable to: transfer light between the first optical port and the first optical recirculation loop in a first configuration (e.g., the ON state of $110_1$, FIG. 1) of said first optical coupling structure; and optically isolate the first optical port and the first optical recirculation loop from one another in a second configuration (e.g., the OFF state of $110_1$, FIG. 1) of said first optical coupling structure.

In some embodiments of any of the above apparatus, the apparatus further comprises a second optical port (e.g., P2, FIG. 1). The apparatus is configured to transfer light between the first optical port and the second optical port in the second configuration of said first optical coupling structure.

In some embodiments of any of the above apparatus, the apparatus is configurable to eject light stored in the first optical recirculation loop either through the first optical port or through the second optical port (with the ejection port being selected by changing the light circulation direction in the recirculation loop, e.g., as described in reference to FIG. 1).

In some embodiments of any of the above apparatus, the apparatus further comprises: a second optical port (e.g., P4, FIG. 1); and a second optical coupling structure (e.g., 110$_4$, FIG. 1) that is configurable to: transfer light between the second optical port and the second optical recirculation loop in a first configuration (e.g., the ON state of 110$_4$, FIG. 1) of said second optical coupling structure; and optically isolate the second optical port and the second optical recirculation loop from one another in a second configuration (e.g., the OFF state of 110$_4$, FIG. 1) of said second optical coupling structure.

In some embodiments of any of the above apparatus, the apparatus further comprises a third optical port (e.g., P2, FIG. 1). The apparatus is configured to transfer light between the first optical port and the third optical port in the second configuration of said first optical coupling structure.

In some embodiments of any of the above apparatus, the optical signal-transfer circuit further comprises: a first optical coupling structure (e.g., 110$_2$, FIG. 1) that is configurable to: transfer light between the optical amplifier and the first optical recirculation loop in a first configuration (e.g., the ON state of 110$_2$, FIG. 1) of said first optical coupling structure; and optically isolate the optical amplifier and the first optical recirculation loop from one another in a second configuration (e.g., the OFF state of 110$_2$, FIG. 1) of said first optical coupling structure; and a second optical coupling structure (e.g., 110$_3$, FIG. 1) that is configurable to: transfer light between the optical amplifier and the second optical recirculation loop in a first configuration (e.g., the ON state of 110$_3$, FIG. 1) of said second optical coupling structure; and optically isolate the optical amplifier and the second optical recirculation loop from one another in a second configuration (e.g., the OFF state of 110$_3$, FIG. 1) of said first optical coupling structure.

In some embodiments of any of the above apparatus, the optical signal-transfer circuit further comprises a mirror (e.g., 114, FIG. 1; 414, FIG. 4B) configured to reflect the optical signal during the optical-signal transfer between the first optical recirculation loop and the second optical recirculation loop.

In some embodiments of any of the above apparatus, each of the first and second optical coupling structures comprises a respective optical ring modulator (e.g., 410, FIG. 4B).

In some embodiments of any of the above apparatus, each of the first and second optical coupling structures comprises a respective 2×2 optical switch (e.g., 110, FIG. 1).

In some embodiments of any of the above apparatus, each of the first and second optical recirculation loops comprises a respective double-spiral planar waveguide structure (e.g., 418$_1$ and 418$_2$, FIG. 4B).

In some embodiments of any of the above apparatus, the optical signal-transfer circuit comprises one or more double-spiral planar waveguide structures (e.g., analogous to 418$_1$ and 418$_2$, FIG. 4B), each configured to operate as an optical delay (e.g., as 116, FIG. 1).

In some embodiments of any of the above apparatus, the apparatus further comprises an integrated photonic circuit (e.g., 200, FIG. 2). The integrated photonic circuit includes the first optical recirculation loop, the second optical recirculation loop, and the optical signal-transfer circuit.

While this disclosure includes references to illustrative embodiments, this specification is not intended to be construed in a limiting sense. Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Throughout the detailed description, the drawings, which are not to scale, are illustrative only and are used in order to explain, rather than limit the disclosure. The use of terms, such as height, length, width, top, bottom, vertical, horizontal, is strictly to facilitate the description of the embodiments and is not intended to limit the embodiments to a specific orientation. For example, height does not imply only a vertical rise limitation, but is used to identify one of the three dimensions of a three dimensional structure as shown in the figures. Such "height" would be vertical where the electrodes are horizontal but would be horizontal where the electrodes are vertical, and so on.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

The functions of the various elements shown in the figures, including any functional blocks labeled as "processors" and "controllers" may be provided through the use of dedicated electronic hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included.

What is claimed is:

1. An apparatus comprising:
   a first optical recirculation loop;
   a second optical recirculation loop; and
   an optical signal-transfer circuit that is configurable to perform an optical-signal transfer between the first optical recirculation loop and the second optical recirculation loop; and
   wherein the optical signal-transfer circuit comprises an optical amplifier configured to amplify an optical signal that is being transferred through the optical signal-transfer circuit between the first optical recirculation loop and the second optical recirculation loop.

2. The apparatus of claim 1, wherein the optical signal-transfer circuit is configured to cause a single pass of the optical signal through the optical amplifier per optical-signal transfer between the first optical recirculation loop and the second optical recirculation loop.

3. The apparatus of claim 1, wherein the optical signal-transfer circuit is further configurable to optically isolate the first optical recirculation loop and the second optical recirculation loop from one another.

4. The apparatus of claim 3, further comprising an electronic controller configured to cause the optical signal-transfer circuit either to perform the optical-signal transfer or to optically isolate the first optical recirculation loop and the second optical recirculation loop from one another.

5. The apparatus of claim 4, wherein the electronic controller is configured to set a storage time for the optical signal by setting a number of optical-signal transfers between the first optical recirculation loop and the second optical recirculation loop.

6. The apparatus of claim 1, wherein the optical signal-transfer circuit is reconfigurable to perform the optical-signal transfer in a first direction or in a second direction, the first direction being from the first optical recirculation loop to the second optical recirculation loop, and the second direction being from the second optical recirculation loop to the first optical recirculation loop.

7. The apparatus of claim 6, wherein the optical amplifier comprises a bidirectional amplifier configured to amplify optical signals transferred through the optical signal-transfer circuit in both the first direction and the second direction.

8. The apparatus of claim 7, wherein the bidirectional amplifier comprises:
   a multimode waveguide having a first end-facet and a second end-facet;
   a first single-mode waveguide end-connected to the first end-facet; and
   a second single-mode waveguide end-connected to the first end-facet; and
   wherein the bidirectional amplifier is configured to:
      direct an optical signal propagating in the first direction from the first single-mode waveguide, through the multimode waveguide, and into the second single-mode waveguide in a manner that causes said optical signal to be reflected from the second end-facet of the multimode waveguide; and
      direct an optical signal propagating in the second direction from the second single-mode waveguide, through the multimode waveguide, and into the first single-mode waveguide in a manner that causes said optical signal to be reflected from the second end-facet of the multimode waveguide.

9. The apparatus of claim 8, wherein at least a portion of the multimode waveguide is configured to operate as an active zone of the bidirectional amplifier.

10. The apparatus of claim 8, wherein at least a portion of either the first single-mode waveguide or the second single-mode waveguide is configured to operate as an active zone of the bidirectional amplifier.

11. The apparatus of claim 1, further comprising:
    a first optical port; and
    a first optical coupling structure that is configurable to:
       transfer light between the first optical port and the first optical recirculation loop in a first configuration of said first optical coupling structure; and
       optically isolate the first optical port and the first optical recirculation loop from one another in a second configuration of said first optical coupling structure.

12. The apparatus of claim 11,
    further comprising a second optical port; and
    wherein the apparatus is configured to transfer light between the first optical port and the second optical port in the second configuration of said first optical coupling structure.

13. The apparatus of claim 12, wherein the apparatus is configurable to eject light stored in the first optical recirculation loop either through the first optical port or through the second optical port.

14. The apparatus of claim 11, further comprising:
    a second optical port; and
    a second optical coupling structure that is configurable to:
       transfer light between the second optical port and the second optical recirculation loop in a first configuration of said second optical coupling structure; and
       optically isolate the second optical port and the second optical recirculation loop from one another in a second configuration of said second optical coupling structure.

15. The apparatus of claim 14,
    further comprising a third optical port; and
    wherein the apparatus is configured to transfer light between the first optical port and the third optical port in the second configuration of said first optical coupling structure.

16. The apparatus of claim 1, wherein the optical signal-transfer circuit further comprises:
    a first optical coupling structure that is configurable to:
       transfer light between the optical amplifier and the first optical recirculation loop in a first configuration of said first optical coupling structure; and optically isolate the optical amplifier and the first optical recirculation loop from one another in a second configuration of said first optical coupling structure; and a second optical coupling structure that is configurable to:
transfer light between the optical amplifier and the second optical recirculation loop in a first configuration of said second optical coupling structure; and optically isolate the optical amplifier and the second optical recirculation loop from one another in a second configuration of said first optical coupling structure.

17. The apparatus of claim 16, wherein the optical signal-transfer circuit further comprises a mirror configured to reflect the optical signal during an optical-signal transfer between the first optical recirculation loop and the second optical recirculation loop.

18. The apparatus of claim 16, wherein each of the first and second optical coupling structures comprises a respective optical ring modulator.

19. The apparatus of claim 16, wherein each of the first and second optical coupling structures comprises a respective 2×2 optical switch.

20. The apparatus of claim 1,
further comprising an integrated photonic circuit; and
wherein the integrated photonic circuit includes the first optical recirculation loop, the second optical recirculation loop, and the optical signal-transfer circuit.

\* \* \* \* \*